United States Patent
Kilmer et al.

(10) Patent No.: US 11,396,415 B2
(45) Date of Patent: Jul. 26, 2022

(54) VESSEL ASSEMBLIES FOR TEMPERATURE CONTROL

(71) Applicant: American Aerogel Corporation, Rochester, NY (US)

(72) Inventors: Derek S. Kilmer, Pittsford, NY (US); Jeffrey R. Sullivan, Rochester, NY (US); Michael Wyrsta, Santa Barbara, CA (US); Zachary Komon, San Diego, CA (US)

(73) Assignee: American Aerogel Corporation, Rochester, NY (US)

( * ) Notice: Subject to any disclaimer, the term of this patent is extended or adjusted under 35 U.S.C. 154(b) by 195 days.

(21) Appl. No.: 15/566,419

(22) PCT Filed: Apr. 14, 2016

(86) PCT No.: PCT/US2016/027638
§ 371 (c)(1),
(2) Date: Oct. 13, 2017

(87) PCT Pub. No.: WO2016/168523
PCT Pub. Date: Oct. 20, 2016

(65) Prior Publication Data
US 2018/0086534 A1    Mar. 29, 2018

Related U.S. Application Data

(60) Provisional application No. 62/147,631, filed on Apr. 15, 2015.

(51) Int. Cl.
*B65D 81/18* (2006.01)
*F25D 3/08* (2006.01)
(Continued)

(52) U.S. Cl.
CPC ............... *B65D 81/18* (2013.01); *F25D 3/00* (2013.01); *F25D 3/08* (2013.01); *F28D 20/026* (2013.01);
(Continued)

(58) Field of Classification Search
CPC ............... B65D 81/18; B65D 81/2015; B65D 81/2023; B65D 81/203; B65D 81/2053;
(Continued)

(56) References Cited

U.S. PATENT DOCUMENTS 1,369,367 A * 2/1921 Thomson ............ A47J 41/0044
220/560.04
2,595,328 A   5/1952 Bowen
(Continued)

FOREIGN PATENT DOCUMENTS

JP        2001330351        11/2001

OTHER PUBLICATIONS

Global Plastic Sheeting. (Dec. 3, 2010). HDPE vs LLDPE vs LDPE. Retrieved Jan. 22, 2021, from https://www.globalplasticsheeting.com/hdpe-vs-lldpe-vs-ldpe Publication Date evidence from the Google search engine is annexed to the NPL reference. (Year: 2010).*
(Continued)

*Primary Examiner* — Miguel A Diaz
(74) *Attorney, Agent, or Firm* — Byrne Poh LLP; Nina R. Horan

(57) ABSTRACT

This present disclosure provides a vessel assembly for use in temperature sensitive shipping that can maintain a payload temperature across a range of temperatures. Importantly, the vessel assembly of the present disclosure reduces the overall packaging materials used in a shipper box and prevents the "wrong" mixture of PCM-containing vessels from being used.

20 Claims, 5 Drawing Sheets

(51) Int. Cl.
  *F28D 20/02* (2006.01)
  *F25D 3/00* (2006.01)
  *G11C 13/00* (2006.01)
(52) U.S. Cl.
  CPC .... *G11C 13/0004* (2013.01); *F25D 2303/082* (2013.01); *F25D 2303/085* (2013.01); *F25D 2303/0822* (2013.01); *F25D 2331/804* (2013.01); *Y02E 60/14* (2013.01)
(58) Field of Classification Search
  CPC ............ B65D 81/2061; B65D 81/2076; B65D 81/2084; B65D 81/2092; B65D 81/22; F25D 3/00; F25D 3/08; F25D 2303/00; F25D 2303/08; F25D 2303/082; F25D 2303/0821; F25D 2303/0822; F25D 2303/08222; F28D 20/021; F28D 20/026; F28D 2020/006; F28D 2020/0065; F28D 2020/0082; F28D 2020/0091; Y02E 60/145; A61F 7/10; A61F 7/103; A61F 7/105; A61F 7/108; A61F 2007/105; A61F 2007/108
  See application file for complete search history.

(56) References Cited

U.S. PATENT DOCUMENTS

| | | | | |
|---|---|---|---|---|
| 2,814,382 | A * | 11/1957 | Lassiter | B65D 81/2023 53/408 |
| 3,893,834 | A * | 7/1975 | Armstrong | A61F 7/106 62/4 |
| 4,344,300 | A * | 8/1982 | Taylor | A45C 11/20 62/371 |
| 4,981,135 | A * | 1/1991 | Hardy | A61F 7/02 602/2 |
| 5,111,957 | A * | 5/1992 | Hollander | B29C 44/569 229/103.11 |
| 5,534,020 | A * | 7/1996 | Cheney, III | A61F 7/03 126/204 |
| 5,609,039 | A * | 3/1997 | Green | A47G 19/2288 62/371 |
| 5,840,080 | A * | 11/1998 | Der Ovanesian | A61F 7/02 607/114 |
| 5,843,145 | A * | 12/1998 | Brink | A61F 7/02 607/114 |
| 6,083,256 | A * | 7/2000 | Der Ovanesian | F28D 20/02 607/114 |
| 6,484,514 | B1 * | 11/2002 | Joseph | B65D 81/3266 62/4 |
| 6,494,056 | B1 * | 12/2002 | Roth | F25D 3/08 62/457.3 |
| 6,675,606 | B1 * | 1/2004 | Jones | F25D 3/08 62/441 |
| 6,868,982 | B2 * | 3/2005 | Gordon | B65D 81/3862 220/592.23 |
| 7,422,143 | B2 * | 9/2008 | Mayer | B65D 81/3816 220/592.2 |
| 7,954,338 | B2 * | 6/2011 | Lien | A45F 3/20 24/30.5 R |
| 8,053,047 | B2 * | 11/2011 | Siegel | B32B 27/08 428/34.1 |
| 8,061,158 | B2 * | 11/2011 | Roth | F25D 3/08 62/457.3 |
| 9,266,659 | B2 * | 2/2016 | Sarcinella | B65D 75/5883 |
| 10,107,541 | B2 * | 10/2018 | Kuczynski | F25D 5/02 |
| 10,378,810 | B2 * | 8/2019 | Na | B65D 81/18 |
| 10,869,777 | B2 * | 12/2020 | Cull | A61F 7/12 |
| 2002/0147242 | A1 * | 10/2002 | Salyer | C08J 9/141 521/50 |
| 2003/0000517 | A1 * | 1/2003 | Joseph | B65D 81/3484 126/263.06 |
| 2004/0173556 | A1 * | 9/2004 | Smolko | F28D 5/00 215/11.5 |
| 2004/0231355 | A1 * | 11/2004 | Mayer | C09K 5/063 62/371 |
| 2007/0275134 | A1 * | 11/2007 | Siegel | B32B 27/304 426/129 |
| 2008/0230508 | A1 * | 9/2008 | Overgaard | A45F 3/16 215/386 |
| 2009/0039045 | A1 * | 2/2009 | Chen | A45F 3/18 215/6 |
| 2010/0084411 | A1 * | 4/2010 | Lien | A45F 3/20 220/592.16 |
| 2011/0185764 | A1 | 8/2011 | Kelly | |
| 2011/0290792 | A1 * | 12/2011 | Krzak | B65D 81/3816 220/1.5 |
| 2013/0174581 | A1 * | 7/2013 | Rasmussen | F25D 5/02 62/4 |
| 2013/0213977 | A1 * | 8/2013 | Stathes | B65D 81/3825 220/592.26 |
| 2014/0054297 | A1 * | 2/2014 | Patstone | F25D 3/08 220/592.01 |
| 2014/0151382 | A1 * | 6/2014 | White | B65D 81/3862 220/592.2 |
| 2014/0263368 | A1 | 9/2014 | Booska | |
| 2014/0331711 | A1 * | 11/2014 | Blezard | F25D 3/08 62/457.2 |
| 2015/0192340 | A1 * | 7/2015 | Andrews | F25D 3/08 62/457.5 |
| 2016/0200501 | A1 * | 7/2016 | Lee | B65D 81/2023 206/213.1 |
| 2017/0253409 | A1 * | 9/2017 | Owens | B65D 25/14 |
| 2017/0314851 | A1 * | 11/2017 | Alexander | F25D 31/005 |
| 2018/0036202 | A1 * | 2/2018 | Wengreen | A61J 1/18 |
| 2018/0099797 | A1 * | 4/2018 | Biesecker Longacre | B65D 50/04 |
| 2018/0135905 | A1 * | 5/2018 | Kuczynski | F25D 5/02 |
| 2018/0162627 | A1 * | 6/2018 | Bessho | B65D 81/3886 |
| 2018/0250116 | A1 * | 9/2018 | Mourhatch | A61F 2/0095 |
| 2018/0251250 | A1 * | 9/2018 | Knoerzer | B65B 55/14 |
| 2018/0328644 | A1 * | 11/2018 | Rizzo | F25D 3/08 |
| 2019/0011147 | A1 * | 1/2019 | Chopard | F24H 1/181 |
| 2019/0177071 | A1 * | 6/2019 | Coulombe | F25D 3/08 |
| 2019/0210790 | A1 * | 7/2019 | Rizzo | B65D 81/3834 |
| 2019/0226744 | A1 * | 7/2019 | Wood | F25D 3/08 |
| 2019/0242636 | A1 * | 8/2019 | Tsuno | F25D 11/003 |
| 2019/0331390 | A1 * | 10/2019 | Chen | A47J 41/0094 |
| 2020/0039723 | A1 * | 2/2020 | Knutsen | B65D 25/00 |

OTHER PUBLICATIONS

European Search Report dated Dec. 14, 2018 in EP Patent Application No. 16780789.0.
International Preliminary Report on Patentability dated Oct. 26, 2017 in International Patent Application No. PCT/US2016/027638.
International Search Report and Written Opinion dated Jul. 15, 2016 in International Patent Application No. PCT/US2016/027638.

* cited by examiner

VESSEL ASSEMBLIES FOR TEMPERATURE CONTROL

1. BACKGROUND

In the field of temperature sensitive shipping, it is desirable to keep the temperature as constant as possible and within a specific temperature range, depending on the type of product being shipped. Typically, this is achieved, in passive systems (i.e., those without mechanical devices), by using a phase change material (PCM) within a shipper box. The PCM offsets the heat energy entering or leaving the shipper box, by absorbing or releasing energy as it changes temperature or as it changes phase from solid to a liquid, solid to a gas or from a liquid to a gas (or vice versa).

A single PCM can be used in situations in which it is desired to maintain a payload at temperature below or above a certain temperature. For example, a single PCM can be used at or near the desired temperature range. However, in situations in which it is desired to maintain a payload within a range of temperatures, a single PCM is not effective. This is because a single PCM is unable to affect or bracket the two different temperatures. Specifically, if a single PCM that changes phase at 4° C. is used to maintain a range of temperatures, such as 2-8° C., then to keep the temperature from falling below 2° C., the PCM must be preconditioned at a temperature of above 4° C. to a liquid state at 6° C. However, this liquid 6° C. PCM is not effective at preventing the temperature from rising above 8° C. If, on the other hand, a different PCM that changes phase at 6° C. is frozen to 4° C. is used, the frozen PCM is effective in preventing the payload from rising in temperature above 8° C., but not effective in preventing the payload from falling in temperature below 2° C.

Thus, in situations in which it is desired to maintain a payload temperature across a range of temperatures, more than one PCM can be used. In practice, a single PCM is placed within a vessel (e.g., a bag, bottle, container and the like). Another PCM, is placed within a second vessel. A mixture of the two vessels are then arranged within a shipper box to achieve the desired temperature range. However, this arrangement often leads to an excess of packaging materials that do not contribute to the desired temperature control because each vessel, when packed, increases the amount of packaging materials within the shipper box, and importantly, adds empty spaces within the shipper box. Moreover, shipper boxes are commonly assembled by personnel who are not experienced with PCMs. What can happen is that, without specific instructions, the wrong mixture of PCM containing vessels may be used, thereby compromising the product being shipped.

2. SUMMARY OF THE DISCLOSURE

This present disclosure provides a vessel assembly for use in temperature sensitive shipping that can maintain a payload temperature across a range of temperatures. Importantly, the vessel assembly of the present disclosure reduces the overall packaging materials used in a shipper box and prevents the "wrong" mixture of PCM-containing vessels from being used.

In one aspect, the present disclosure provides a vessel assembly comprising a vessel having a first filling port; and a bladder having a second filling port. The chamber of the vessel comprises a first PCM and the bladder comprises a second PCM.

In a second aspect, the present disclosure provides a method of preparing a vessel assembly for maintaining a payload temperature across a range of temperatures, the method comprising placing a bladder having a first filling port within the chamber of a vessel having a second filling port; filling the bladder with a first PCM; and filling the chamber vessel with a second PCM.

In a third aspect, the present disclosure provides a method of transporting a payload to a desired location using any of the vessel assemblies described herein.

In a fourth aspect, the present disclosure provides a method of insulating a payload using any of the vessel assemblies described herein.

In a fifth aspect, the present disclosure provides a method of maintaining payload temperature across a range of temperatures using any of the vessel assemblies described herein.

3. BRIEF DESCRIPTION OF THE FIGURES

4. DETAILED DESCRIPTION

Figure 1:
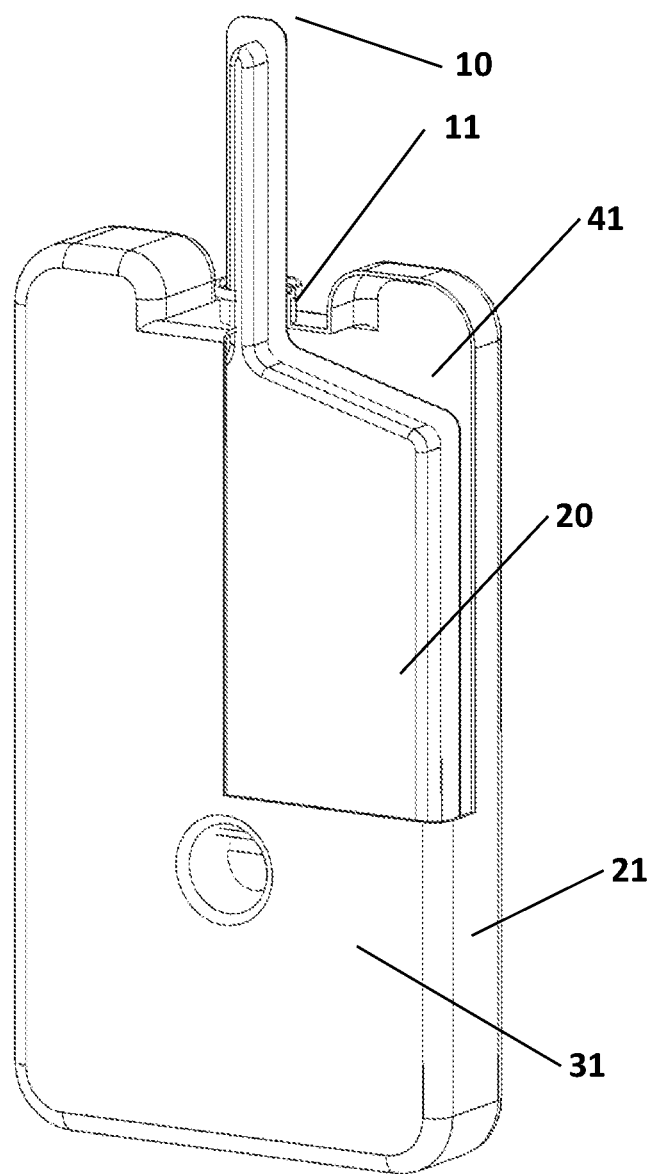
FIG. 1 is an isometric view of a vessel assembly according to an embodiment of the disclosure.

The invention includes the following:

(1) A vessel within which is contained a bladder, each of which contains separate and different temperature control materials.

(2) The vessel of the above (1) which is made from a rigid material.

(3) The vessel of the above (2) whereby the material is polyethylene or other suitable material or composite.

(4) The bladder of the above (1) being of flexible material.

(5) The bladder of the above (4) which is made from polyethylene or other suitable material or composite.

(6) The temperature control materials of claim (1) being chosen from the group consisting of: water, paraffin wax, octadecane, or alkanes of the formula $C_nH_{2n+2}$, alkenes of the formula $C_nH_{2n}$, long chain alcohols, fatty acids, esters of fatty acids, ethylene glycol, propylene glycol, eutectic mixtures, and hydrated salt(s) i.e. water mixed with a single chemical or combination of chemicals from the group consisting of, but not limited to: sodium chloride, calcium chloride, sodium sulfate, ammonium nitrate, potassium carbonate, ammonium chloride, and potassium chloride.

(7) The bladder of the above (4) which is replaced by separate multiple bladders in the shape of long tubes.

(8) The multiple bladders of the above (5) containing the same temperature control material.

(9) The multiple bladders of the above (5) containing two or more temperature control materials.

(10) The vessel of the above (2) and the bladder of the above (5) which have dimensions and materials selected to enable the bladder(s) to be squeezed with a hand from the outside of the vessel to determine in the temperature control material within the bladder(s) is hard or soft to determine if it is in a solid or liquid state.

(11) The vessel of the above (2) which has an area designated where to squeeze the vessel designated by one of more of the following methods: vessel shape has an indented area, markings as part of vessel, printing on vessel, and/or label adhered to vessel.

(12) A vessel assembly comprising
a vessel having a first filling port; and
a bladder optionally having a second filling port;
   wherein the chamber of the vessel comprises a first phase change material; and
   the bladder comprises a second phase change material.

(13) The vessel assembly of the above (12), wherein the vessel comprises a rigid material.

(14) The vessel assembly of the above (13), wherein the rigid material is a material selected from polyethylene, polypropylene, EVOH, nylon, fluorinated PE, fluorinated PP, PTFE, a fluorinated polymer, coextruded PE/Nylon, PP/Nylon, PE/EVOH and PP/EVOH.

(15) The vessel assembly of any one of the above (12) to (14), wherein the bladder comprises a flexible material.

(16) The vessel assembly of any one of the above (12) to (15), wherein the flexible material comprises a material selected from polyethylene, polypropylene, EVOH, Nylon, fluorinated PE, fluorinated PP, PTFE, a fluorinated polymer, coextruded PE/Nylon, PP/Nylon, PE/EVOH and PP/EVOH.

(17) The vessel assembly of any one of the above (12) to (16), wherein the first and second phase change material are selected from the group consisting of water, paraffin wax, alkanes, alkenes, fatty alcohols, fatty acids, fatty esters, ethylene glycol, propylene glycol, eutectic mixtures, and hydrated salt(s).

(18) The vessel assembly of the above (17), wherein the hydrated salt is selected from the group consisting of sodium chloride, calcium chloride, sodium sulfate, ammonium nitrate, potassium carbonate, ammonium chloride, and potassium chloride.

(19) The vessel assembly of any one of the above (1) to (18), wherein the vessel comprises a plurality of bladders, each of which has a filling port and comprises a phase control material.

(20) The vessel assembly of the above (19), wherein the plurality of bladders comprise the same phase control material.

(21) The vessel assembly of the above (19), wherein the plurality of bladders comprise two or more phase control materials.

(22) The vessel assembly of the above (19), wherein the vessel comprises a first bladder and a second bladder.

(23) The vessel assembly of the above (22), wherein the first bladder is next to the second bladder.

(24) The vessel assembly of the above (22), wherein the first bladder is within the second bladder.

(25) The vessel assembly of any of the above (12) to (24), further comprising a temperature indicator.

(26) The vessel assembly of any of the above (12) to (25), further comprising a cooling fin.

(27) The vessel assembly of any of the above (12) to (26), further comprising electronics.

(28) A method of preparing a vessel assembly for maintaining a payload temperature across a range of temperatures, the method comprising
   a. placing a bladder having a first filling port within the chamber of a vessel having a second filling port;
   b. filling the bladder with a first PCM; and
   c. filling the chamber vessel with a second PCM.

(29) A method of transporting a payload to a desired location, the method comprising
   a. placing a vessel assembly according to any one of the above (12) to (27) and preconditioned to a specific temperature within a shipper box;
   b. placing a payload within the shipper box;
   c. transporting the shipper box comprising the payload to the desired location.

(30) A method of insulating a payload, the method comprising
   a. providing a vessel assembly according to any one of the above (12) to (27) and preconditioned to a specific temperature within a shipper box; and
   b. placing a payload within the shipper box.

(31) A method of maintaining a payload temperature within a range, the method comprising:
   a. providing a vessel assembly according to any one of the above (12) to (27) and, preconditioned to a specific temperature, within a shipper box; and
   b. placing a payload within the shipper box;
wherein the vessel assembly maintains the payload temperature within the range.

4.1 Definitions

Unless defined otherwise, all technical and scientific terms used herein have the same meaning as those commonly understood by one of ordinary skill in the art to which this invention belongs. Although methods and materials similar or equivalent to those described herein can be used in the practice or testing of the present invention, suitable methods and materials are described below. The materials, methods and examples are illustrative only, and are not intended to be limiting. All references, publications, patents, patent applications and other documents mentioned herein are incorporated by reference in their entirety. Unless clearly indicated otherwise, the following terms as used herein have the meanings indicated below.

Throughout this specification, the word "comprise" or variations such as "comprises" or "comprising" will be understood to imply the inclusion of a stated integer or groups of integers but not the exclusion of any other integer or group of integers.

The term "a" or "an" may mean more than one of an item.

The terms "and" and "or" may refer to either the conjunctive or disjunctive and mean "and/or".

The term "about" means within plus or minus 10% of a stated value. For example, "about 100" would refer to any number between 90 and 110.

The term "phase change material" refers to a substance that absorbs and releases thermal energy while changing from one phase to another, e.g., melting and freezing. Since PCMs undergo this energy change isothermally, or nearly isothermally, very narrow temperature ranges can be maintained. Examples of phase change materials include water, paraffin wax, ethylene glycol, propylene glycol, alkanes, fatty alcohols, fatty acids, fatty esters, eutectic mixtures, and hydrated salts.

The term "alkane" refers to a saturated hydrocarbon having the formula $C_nH_{2n+2}$ and having a melting point in the range of about −30° C. to about 40° C. In one embodiment, the alkane has a latent heat in the range of about 150 kJ/kg to about 280 kJ/kg. In another embodiment, the alkane has a latent heat in the range of about 175 kJ/kg to about 280 kJ/kg. In another embodiment, the alkane has a latent heat in the range of about 200 kJ/kg to about 280 kJ/kg. In another embodiment, the alkane has a nearly isothermal melting transition. When an alkyl residue having a specific number of carbons is named, all geometric isomers having that number of carbon atoms are intended to be encompassed; thus, for example, when decane is named, it includes, inter alia, n-decane, 2-methylnonane, 3-methylnonane, 4-methylnonane, 5-methylnonane, 3-ethyloctane, 4-ethyloctane, 2,2-dimethyloctane, etc. Examples of alkanes include decane, undecane, dodecane, tridecane, tetradecane, pentadecane, hexadecane, heptadecane, octadecane, nonadecane, and icosane. In one embodiment, the alkane is selected from hexadecane, heptadecane, octadecane and nonadecane. In another embodiment, the alkane is selected from hexadecane, heptadecane, and octadecane. In another embodiment, the alkane is selected from hexadecane, heptadecane, and nonadecane. In another embodiment, the alkane is selected from heptadecane, octadecane and nonadecane.

The term "alkene" refers to an unsaturated hydrocarbon having the formula $C_nH_{2n}$ and having a melting point in the range of about −40° C. to about 40° C. In one embodiment, the alkane has a latent heat in the range of about 150 kJ/kg to about 280 kJ/kg. In another embodiment, the alkane has a latent heat in the range of about 175 kJ/kg to about 280 kJ/kg. In another embodiment, the alkane has a latent heat in the range of about 200 kJ/kg to about 280 kJ/kg. In another embodiment, the alkane has a nearly isothermal melting transition. Examples of alkanes include dodecene, tridecene, tetradecene, pentadecene, hexadecene, heptadecene, octadecene, nonadecene, eicosene, and docosene. In one embodiment, the alkene is selected from 1-dodecene, 1-tetradecene, 1-hexadecene, 1-octadecene, 1-icosene, 1-docosene. In another embodiment, the alkene is 1-octadecene or 1-icosene.

The term "fatty alcohol" refers to an alkane or an alkene with an alcohol group and having a melting point in the range of about −20° C. to about 40° C. When an alkyl residue having a specific number of carbons is named, all geometric isomers having that number of carbon atoms are intended to be encompassed. Examples of fatty alcohols include octanol, nonanol, decanol, undecyl alcohol, dodecanol, tridecanol, myristyl alcohol, pentadecyl alcohol, hexadecanol and palmitoleyl alcohol. In one embodiment, the fatty alcohol is selected from octanol, decanol, dodecanol, myristyl alcohol, hexadecanol and palmitoleyl alcohol.

The term "fatty acid" refers to an alkane or alkene with a carboxylic acid group and having a melting point in the range of about −5° C. to about 40° C. When an alkyl or alkenyl residue having a specific number of carbons is named, all geometric isomers having that number of carbon atoms are intended to be encompassed. Examples of fatty acids include acetic acid, propionic acid, butyric acid, pentanoic acid, hexanoic acid, heptanoic acid, octanoic acid, nonanoic acid, decanoic acid, undecanoic acid and dodecanoic acid.

The term "fatty esters" refers to a fatty acid in which the carboxylic acid group is replaced with an ester and having a melting point in the range of about −40° C. to about 80° C. Examples of fatty esters include methyl, ethyl, propyl, and butyl esters of decanoic acid, undecanoic acid, dodecanoic acid, tridecanoic acid, tetradecanoic acid, pentanoic acid, hexanoic acid, heptanoic acid, and octanoic acid.

The term "hydrated salt(s)" refers to water mixed with a single salt or combination of salts. Examples of salts include sodium chloride, calcium chloride, sodium sulfate, ammonium nitrate, potassium carbonate, ammonium chloride, and potassium chloride.

The term "eutectic mixture" refers to the lowest melting composition of a mixture of two components. Examples of eutectics include about a 1:2 of choline chloride to urea, acetamide, thiourea, trichloroacetic acid, phenlyacetic acid, malonic acid, oxalic acid, p-toluene sulfonic acid, m-cresol, phenol, ethylene glycol, glycerol, or D-(-)-fructose. In one embodiment, the eutectics mixture is about a 1:2 ratio of choline chloride to p-toluenesulfonic acid or about 1:2 ratio of choline chloride to oxalic acid.

The term "open cell foam" is a type of foam in which greater than about 50% of the cells are open and/or interconnected by pores on the cell walls. Pore size can range in size from 1 nm to 100 um. Examples of open cell foams include floral foam, pressed silica, polyurethane-based foams, EVA foams, polyesters, epoxide foams, vinyl-based foams, wood (e.g. balsa) and cellulosic foams.

4.2 Vessel Assemblies

The present disclosure provides a vessel assembly for use in temperature sensitive shipping that can maintain a payload temperature across a range of temperatures. The vessel assembly comprises two or more PCMs. By using two or more PCMs in a single vessel assembly, the overall packaging materials used in a shipper box is reduced. Advantageously, the single vessel assembly comprising two or more PCMs prevents the "wrong" mixture of PCM-containing vessels from being used.

The PCMs used in the vessel assembly of the disclosure can be any solid, liquid or gas that changes phase from one form to another and allows for the absorption or release of heat. The PCMs used in the vessel assembly are selected from alkanes, fatty alcohols, fatty acids, fatty esters, eutectic mixtures, hydrated salts and eutectic mixtures. The amount of PCMs used in the vessel assemblies of the disclosure can be varied to provide a range of thermal properties to meet the desired temperature control requirements. The optimal ratio of the first PCM to the second PCM depends on the particular temperature range and the ambient temperature vs time profile.

Referring now to FIG. 1, one aspect of the disclosure provides a vessel assembly 31 comprising a vessel 21 having a first filling port 11. The vessel 21 is constructed from a material selected from polyethylene, polypropylene, EVOH, nylon, fluorinated PE, fluorinated PP, PTFE, a fluorinated polymer, coextruded PE/Nylon, PP/Nylon, PE/EVOH, PP/EVOH, aluminum, steel, stainless steel and copper alloys. In one embodiment, the vessel is rigid. In another embodiment, the vessel is flexible. The vessel 21 comprises a bladder 20 optionally having a second filling port 10. The bladder 20 is constructed from a material selected from polyethylene, polypropylene, EVOH, Nylon, fluorinated PE, fluorinated PP, PTFE, a fluorinated polymer, coextruded PE/Nylon, PP/Nylon, PE/EVOH and PP/EVOH, aluminum foil-PE lamination. In one embodiment, the bladder is rigid. In another embodiment, the bladder is flexible.

In deciding whether the vessel and bladder are rigid or flexible, the following considerations are taken into account: providing a barrier to the PCM, durable for handling, manufacturable to required shape, and cost. For rigid vessels manufactured from a polymeric material, the material must be formable into the desired vessel shape via, inter alia, blow-molding, coextrusion blow-molding, vacuum forming, injection molding, and/or thermal or solvent joining, and the like. For rigid vessels manufactured from metallic material, the material must be formable into the desired shape via, inter alia, punching, extrusion, hydraulic forming, drawing and forming, flanging, and/or seaming, etc. For flexible vessels, the polymer must be formable into the desired layer construction and shape via, inter alia, extrusion blowing, casting, coextrusion, lamination, cutting, thermal welding, and/or heat sealing The must be heat sealable (PE, PP, or EVOH inner layer). It can be appreciated that other methods of manufacturing rigid or flexible vessel and bladders may be used.

The vessel may be coated or treated to prevent leakage or bleeding of the PCMs. In one embodiment, the vessel is coated or treated. In another embodiment, the vessel is coated and treated. In another embodiment, the vessel is coated. In embodiments in which the vessel is coated, it may be coated with epoxy resin, PVA/PVOH, $SiO_2$, $Al_2O_3$ fluorinated polymers, such as PTFE, PFA, and blends thereof. In another embodiment, the vessel is treated. In embodiments in which the vessel is treated, it may be treated with a treatment selected from fluorine, electron beam, plasma, or corona treatments or combinations thereof. In another embodiment, the vessel is uncoated. Whether the vessel is coated depends on the particular construction material of the vessel and the particular PCM used. For example, paraffin-based PCMs can permeate through high density polyethylene, which would cause contamination on the outside of the vessel assembly and would cause loss of PCM mass. Fluorination of the high density polyethylene vessel would thus make the vessel wall surface more polar and greatly reduce the permeation rate and improve the usable life of the PCM.

Figure 2:
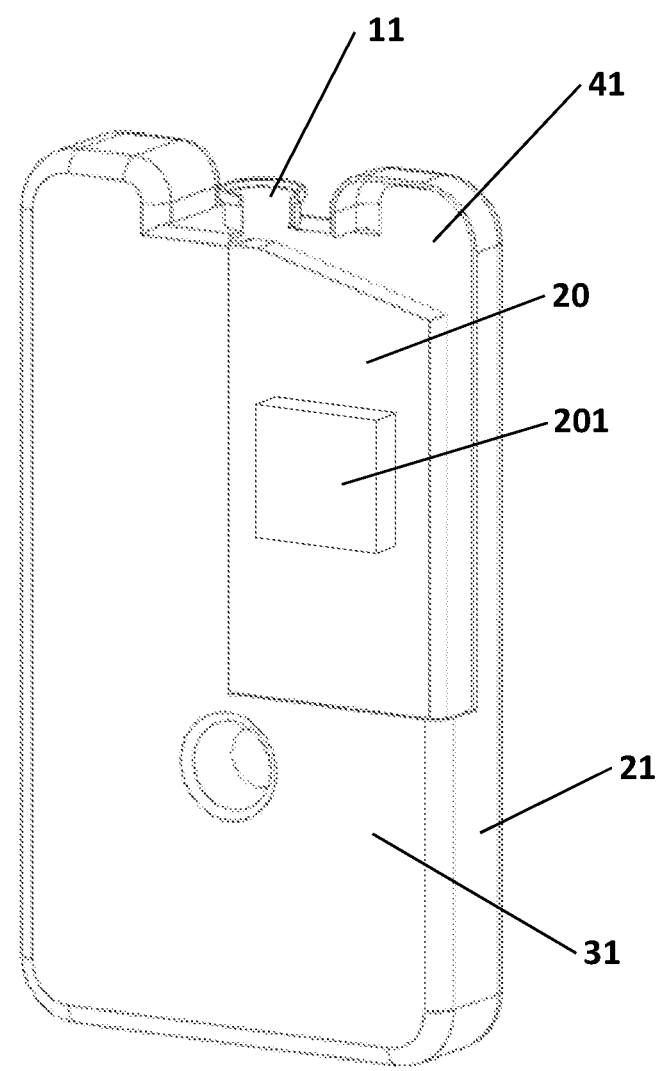
FIG. 2 is an isometric view of a vessel assembly according to an embodiment of the disclosure, similar to that of FIG. 1, but showing the bladder filling port in the retracted position.

Referring back to FIG. 1, the bladder 20 is filled with a first PCM through its filling port 10. After the bladder 20 is filled with the first PCM, the filling port 10 is sealed. The filling port 10 can be permanently sealed, e.g., using a heat sealer, or temporarily sealed with a cap. After sealing, the filling port 10 is optionally retracted into the vessel chamber 41, as indicated in FIG. 2. Next, the vessel chamber 41 is filled with a second PCM through the vessel filling port 11. After filling, the vessel 21 can be permanently sealed, temporarily sealed or permanently and hermetically sealed. A plug, e.g., a high density polyethylene plug, designed to fit into the vessel filling port can be used to create a permanent seal. After insertion of the plug, a hermetic seal can be achieved by locally heating the interface between the plug and the vessel and melting the two plastic surfaces together.

In embodiments in which the vessel or the bladder are made from flexible materials, it may be desirable to mix the PCM with an open-cell material to stabilize the form of the vessel or bladder. In some embodiments, one or both of the vessel chamber 41 and bladder 20 are filled with a PCM and an open-celled material. In one embodiment, the vessel chamber 41 is filled with a PCM and an open-celled material. In a second embodiment, bladder 20 is filled with a PCM and an open-cell material. In a third embodiment, both the vessel chamber 41 and bladder 20 are filled with a PCM and an open-celled material.

While the vessel 21 is depicted in FIG. 1 as a rectangle, it should be understood that any shape can be used and tailored to the size and shape of the payload. For example, the vessel can have a rectangular profile on one face and a semi-cylindrical profile on the opposite face. Such a shape can be used for cylindrical payloads. In addition, the opposite face can be semi-cylindrical, rectangular with other dimensions, or any shape that provides a volume-efficient fit to the payload. The vessel can optionally comprise an internal feature that functions to restrict the movement of the bladder 20. Restricting the movement of the bladder improves its durability and assists in positioning the bladder for the filling process.

The bladder may be in any size or shape, limited only by its ability to be placed within vessel through the vessel filling port. For example, the bladder can be in the shape of a pouch, a packet and a tube. When the bladder is a pouch, it can be placed within the vessel empty and filled from its filling port. Alternatively, in situations in which finer control on the amount of PCM added to the assembly is required, the bladder may be a small packet. The packet can be made without a filling port. When the bladder is a tube, the tube can be sized to best fit the interior dimensions of the vessel. In some situations, the bladder can be a long tube that is fed in and folds up with the vessel, thereby providing flexibility in the amount of PCM used (length of the tube) and provides a benefit in that only part needs to be inserted. When the bladder is a tube, it can be filled in-line, or be pre-filled with PCM and simply placed into the vessel by hand or automatic machine. The vessel assembly can optionally comprise further features. In one embodiment, the vessel assembly further comprises a temperature indicator to provide the surface temperature of the vessel or the internal temperature of the vessel. In one embodiment, the temperature indicator can be integrated or part of the outside of the vessel. In another embodiment, the temperature indicator can be integrated on the surface of the inner bladder. In embodiments in which the temperature indicator is integrated on the surface of the inner bladder, the vessel is translucent to allow visual inspection of the internal temperature indicator.

The temperature indicator may be a mechanical device, such as a bimetallic disk, strip, or coiled spring, etc. that reacts to temperature and provides a visual indication. The temperature indicator may be a chemical device, such as a phase change, leuco dye, thermochromic material, liquid crystal, etc. that reacts to temperature and provides a visual indicator through change in color or opacity.

In another embodiment, the vessel assembly further comprises a cooling fin to increase thermal transfer rates.

In another embodiment, the vessel assembly further comprises electronics. The electronics can be integrated into or onto the vessel. Examples of useful electronics include RFID, temperature sensors, humidity sensors, accelerometers, GPS and the like.

The vessel assembly can be configured so that the temperature of the PCM within the bladder(s) can be determined. For example, the vessel and the bladder(s) can be of particular dimensions and materials to allow the bladder(s) to be squeezed from the outside of the vessel assembly. The temperature of the PCM can be determined by observing whether the PCM is hard or soft, i.e., in the solid or liquid state. The vessel assembly can optionally comprise an indentation area, markings on the vessel, printing on the vessel or label attached to the vessel designating an area for squeezing.

Figure 3:
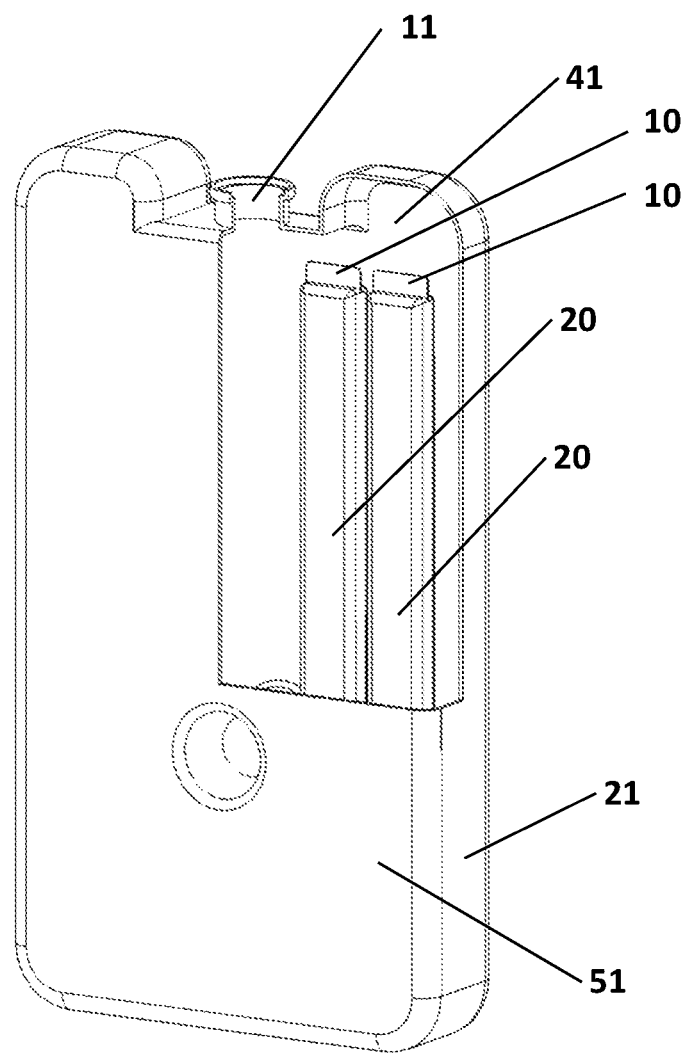
FIG. 3 is an isometric view of a vessel assembly comprising four bladders according to an embodiment of the disclosure.

Another aspect of the present disclosure provides a plurality of bladders placed within a vessel. The number of bladders placed within the vessel, and the amount of PCM added to each bladder, can be varied to provide a range of thermal properties to meet the desired temperature control requirements. Referring to FIG. 3, vessel assembly 51 comprises two bladders 20 are placed within vessel 21. Each bladder is filled with a PCM in the same manner as described above for single bladder-vessels. In one embodiment, each of the plurality of bladders comprises the same PCM. In another embodiment, the plurality of bladders comprise two or more PCMs.

Figure 4:
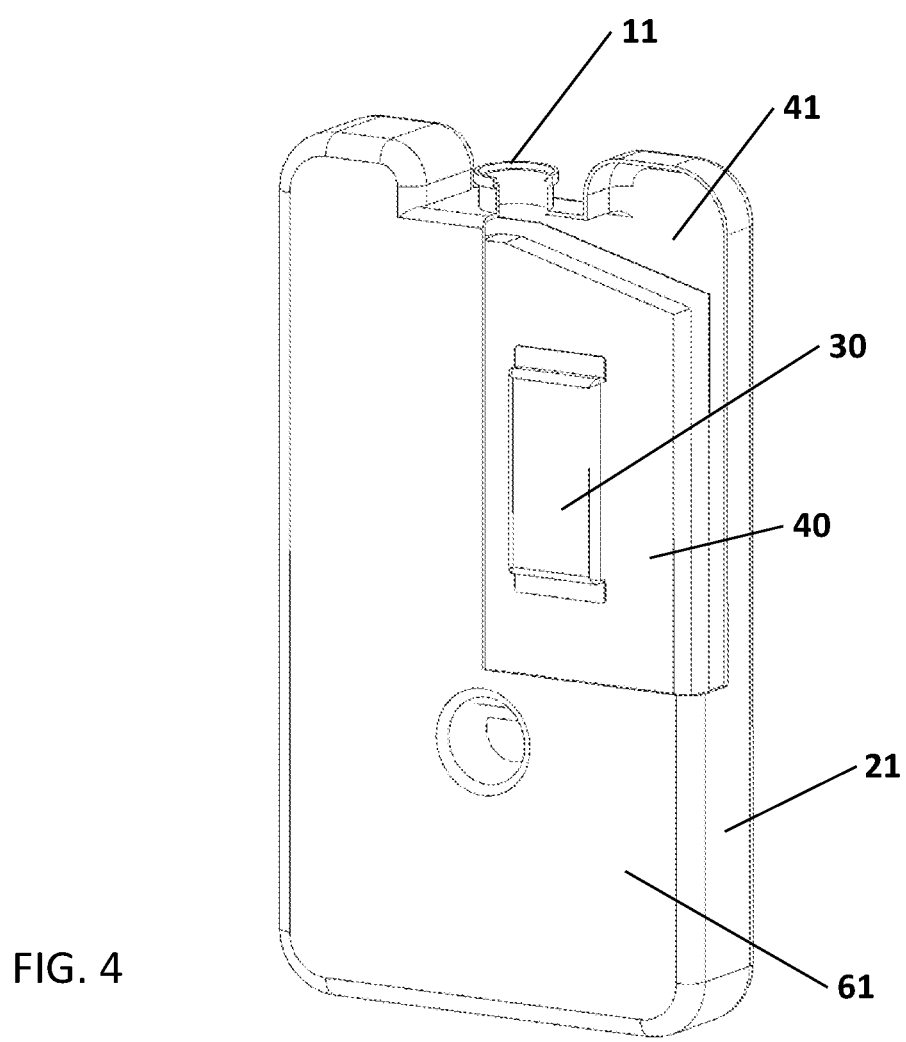
FIG. 4 is an isometric view of a vessel assembly comprising a first bladder within a second bladder according to an embodiment of the disclosure.

Another aspect of the disclosure provides a vessel assembly 61 comprising a first bladder 30 within a second bladder 40 within vessel 21, as indicated in FIG. 4. In assembly, the first bladder 30 is placed with the second bladder 40, which, in turn, is placed within vessel 21. The first bladder 30 is then filled with a first PCM through its filling port (not shown). Alternatively, the first bladder contains a temperature indicator. Next the filling port of the first bladder 30 is sealed, either permanently or temporarily, as described herein. The second bladder 40 is then filled with a second PCM through its filling port (not shown). After filling, the filling port of the second bladder 40 is sealed, either permanently or temporarily, as described herein. Next, the vessel chamber 41 is filled with a third PCM through the vessel filling port 11. After filling, the vessel can be permanently sealed, temporarily sealed or permanently and hermetically sealed, as described herein. This vessel assembly allows for further tailoring the desired temperature range.

Another aspect of the disclosure provides a vessel assembly for use in applications in which proper preconditioning of the PCM is not available. In this aspect, the vessel assembly comprises a first bladder within a second bladder within vessel, as shown in FIG. 4. The first bladder and the second bladder contain chemicals that, when combined, undergo a chemical reaction that is either exothermic or endothermic. This chemical reaction can precondition the PCM-containing vessel by adding or removing heat from the PCM and ensuring it is in the proper phase (solid or liquid) prior to being used in a shipment. As can be appreciated, the chemical reaction can be initiated by squeezing or bending the outer vessel, e.g., in a specific location.

Figure 5:
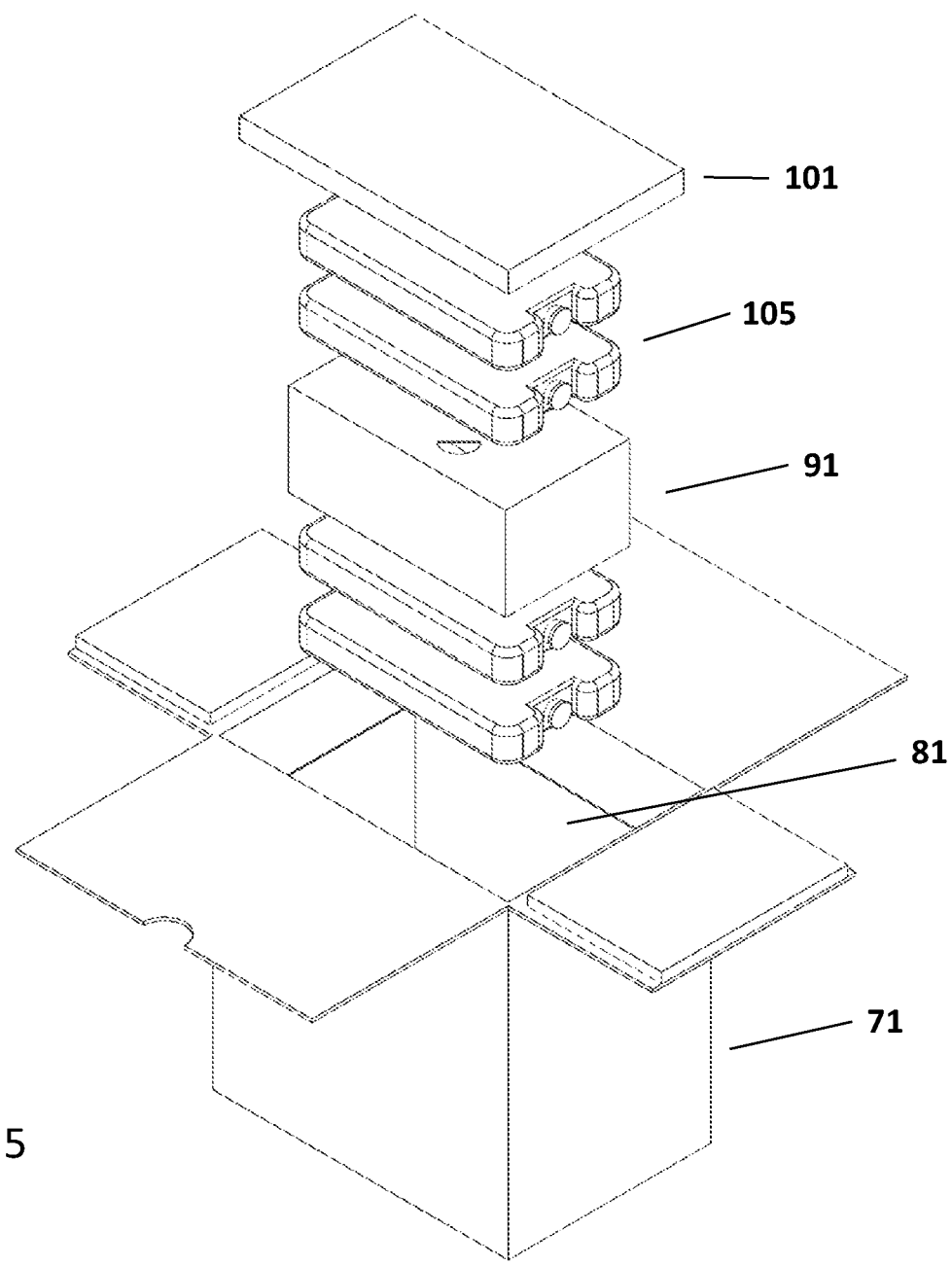
FIG. 5 is an exploded view of a shipper box including a vessel assembly of the present disclosure.

The vessel assemblies described herein are designed to be useful in temperature control shipping. Referring to FIG. 5, the shipper box 71 comprises an insulated container 81, a payload box 91, an insulation lid 101 and vessel assemblies 105. The payload box comprises the temperature-sensitive payload. While FIG. 5 shows a shipper box containing four vessel assemblies, it is to be understood that the number, and nature, of the vessel assemblies can be varied depending on the desired temperature control. For example, a shipper box can contain four vessel assemblies each of which has the same set of PCMs or four vessel assemblies, at least one different set of PCMs. Similarly, the shipper box can contain one vessel assembly or more.

4.3 Methods of Use

The present disclosure also provides methods of transporting a payload to a desired location. This method comprises placing a vessel assembly within a shipper box; placing a payload within the shipper box; and transporting the shipper box comprising the payload to the desired location. The vessel assembly may be any of the vessel assemblies described herein.

The present disclosure also provides methods of insulating a payload. The method comprises providing a vessel assembly within a shipper box; and placing a payload within the shipper box. The vessel assembly insulates the payload.

The present disclosure further provides methods of maintaining a payload temperature within a range. The method comprises providing a vessel assembly within a shipper box; and placing a payload within the shipper box. The vessel assembly maintains the payload temperature within the range.

In order that this invention be more fully understood, the following examples are set forth. These examples are for the purpose of illustration only and are not to be construed as limiting the scope of the invention in any way.

5. EXAMPLE

The following example is presented for illustrative purposes and should not serve to limit the scope of the disclosed subject matter.

The vessel assemblies disclosed herein can be made according to the method that follows.

The properties of the vessel were as follows. The vessel was made from high density polyethylene and manufactured using a blow-molding process. The vessel was rectangular in shape and has dimensions in inches of 6 W×10.5 H×1.5 thick with a total volume of 1270 mL. The vessel filling port has an inner diameter of 0.75 inches.

The properties of the bladder were as follows. The bladder was made from a plastic film, specifically 1 mil Nylon/5.5 mil polyethylene co-extrusion. The bladder was assembled from two pieces of film cut to shape and sealed together using a heat sealer. When laid flat, the bladder had measurements in inches of 5.5 wide and 5.5 tall. The bladder filling port extended an additional 4 inches giving an overall height of 9.5 inches.

The vessel assembly was prepared by placing the bladder within the vessel. This was accomplished by rolling up the bladder and inserting it through the vessel filling port. The bladder was then filled through the bladder filling port with 423 mL of liquid Microtek PCM-24, a PCM having a melting point of 24° C. As it was being filled, the bladder "unrolled" and filling continued. Once filled, the bladder filling port was permanently sealed using an impulse heat sealer. A length of approximately 1 inch is cut off of the bladder filling port, above the sealed area. The bladder filling port was then pushed into the opening of the vessel until the bladder was entirely within the vessel. The vessel was then filled through the vessel filling port with 846 mL of liquid Microtek PCM-19.7, a PCM having a melting point of 19.7° C. The PCM flowed into the vessel chamber filling the remaining volume.

The vessel was then permanently and hermetically sealed with a high density polyethylene plug. A hermetic seal was achieved by using an ultrasonic welder to locally heat the interface between the plug and vessel and melt the two plastic surfaces together. The plug was flush with the outside of the vessel.

The vessel has internal features that contain the bladder so that it does not move excessively within the vessel. A "tack-off" feature that was formed in the blow-molding process kept the bladder in the upper half of the container.

While the invention has been disclosed in some detail by way of illustration and example for purposes of clarity of understanding, it is apparent to those in the art that various changes may be made and equivalents may be substituted without departing from the true spirit and scope of the invention. Therefore, the description and examples should not be construed as limiting the scope of the invention.

What is claimed is:
1. A method of preparing a vessel assembly for maintaining a payload temperature across a range of temperatures, the method comprising
   a. placing a bladder having a first filling port within a chamber of a vessel having a second filling port;
   b. filling the bladder of step (a) with a first PCM preconditioned at a first predetermined temperature;
   c. permanently sealing the bladder of step (b);

d. following step (c), filling the chamber of the vessel with a second PCM preconditioned at a second predetermined temperature; and e. permanently sealing the vessel of step (d).

2. A vessel assembly comprising a vessel comprising a high density material and having a chamber, a first filling port and a permanent seal, the chamber of the vessel comprising a first phase change material; and a bladder with a second filling port that is elongated, such the second filling port can, in a retractable manner, pass through and extend beyond the first filling port, the bladder being within the vessel and comprising a second phase change material, the second filing port comprising a permanent seal;

the first and second phase change materials being selected from the group consisting of paraffin wax, alkanes, alkenes, fatty alcohols, fatty acids, fatty esters, ethylene glycol, propylene glycol, eutectic mixtures, and hydrated salt(s).

3. A vessel assembly comprising a vessel having a chamber, a first filling port and a permanent seal, the chamber of the vessel comprising a first phase change material; and a bladder with a second filling port that is elongated, such that the second filling port can, in a retractable manner, pass through and extend beyond the first filling port, the bladder being within the vessel and comprising a second phase change material, the second filing port comprising a permanent seal;

the first and second phase change materials being selected from the group consisting of paraffin wax, alkanes, alkenes, fatty alcohols, fatty acids, fatty esters, ethylene glycol, propylene glycol, eutectic mixtures, and hydrated salt(s).

4. The vessel assembly of claim 3, wherein the vessel comprises a high density material selected from polyethylene, polypropylene, EVOH, nylon, fluorinated PE, fluorinated PP, PTFE, a fluorinated polymer, coextruded PE/Nylon, PP/Nylon, PE/EVOH and PP/EVOH.

5. The vessel assembly of claim 3, wherein the bladder comprises a material selected from polyethylene, polypropylene, EVOH, Nylon, fluorinated PE, fluorinated PP, PTFE, a fluorinated polymer, coextruded PE/Nylon, PP/Nylon, PE/EVOH and PP/EVOH.

6. The vessel assembly of claim 3, further comprising a temperature indicator.

7. The vessel assembly of claim 3, further comprising electronics.

8. A method of transporting a payload to a desired location, the method comprising a. placing a vessel assembly according to claim 3 within a shipper box;

b. placing a payload within the shipper box;

c. transporting the shipper box comprising the payload to the desired location.

9. A method of insulating a payload, the method comprising a. providing a vessel assembly according to claim 3 within a shipper box; and b. placing a payload within the shipper box.

10. A method of maintaining a payload temperature within a range, the method comprising:

a. providing a vessel assembly according to claim 3 within a shipper box; and b. placing a payload within the shipper box;

wherein the vessel assembly maintains the payload temperature within the range.

11. The vessel assembly of claim 3, wherein the vessel comprises high density polyethylene.

12. The vessel assembly of claim 3, wherein the bladder comprises coextruded PE/Nylon.

13. The vessel assembly of claim 3, wherein the first and second phase change materials are hydrated salt(s).

14. The vessel assembly of claim 13, wherein the hydrated salt(s) are selected from the group consisting of sodium chloride, calcium chloride, sodium sulfate, ammonium nitrate, potassium carbonate, ammonium chloride, and potassium chloride.

15. The vessel assembly of claim 3, wherein the vessel comprises a plurality of bladders, each of which has a filling port and comprises the second phase change material.

16. The vessel assembly of claim 15, wherein the plurality of bladders comprises the same phase change material.

17. The vessel assembly of claim 15, wherein the plurality of bladders comprises two or more phase change materials.

18. The vessel assembly of claim 15, wherein the vessel comprises a first bladder and a second bladder.

19. The vessel assembly of claim 18, wherein the first bladder is next to the second bladder.

20. The vessel assembly of claim 18, wherein the first bladder is within the second bladder.

* * * * *